United States Patent [19]
Fujikura

[11] Patent Number: 5,631,940
[45] Date of Patent: May 20, 1997

[54] THIN FILM BOOT STRAP SHIFT REGISTER

[75] Inventor: Katsuyuki Fujikura, Tokyo, Japan

[73] Assignee: NEC Corporation, Tokyo, Japan

[21] Appl. No.: 627,317

[22] Filed: Apr. 1, 1996

[30] Foreign Application Priority Data

Mar. 31, 1995 [JP] Japan .................................. 7-075122

[51] Int. Cl.⁶ ................................................ G11C 19/00
[52] U.S. Cl. ................................... 377/64; 377/71; 377/79
[58] Field of Search .................................. 377/78–79, 70, 377/71, 64

[56] References Cited

U.S. PATENT DOCUMENTS 5,517,542  5/1996  Hua ............................................ 377/76

FOREIGN PATENT DOCUMENTS 5-30278    2/1993  Japan .
5-267636  10/1993  Japan .

*Primary Examiner*—Margaret Rose Wambach
*Attorney, Agent, or Firm*—Sughrue, Mion, Zinn, Macpeak & Seas

[57] ABSTRACT

A signal transfer circuit for dynamic action with boot strap effect is formed with an inputting transistor $Tr_{11}$ and a driving transistor $Tr_{12}$ for driving a load $Z_1$. To a gate electrode of a resetting transistor $Tr_{13}$, a positive voltage $V_1$ and a negative voltage $V_2$ are alternately applied at 50% of duty ratio in synchronism with a shift pulse by transistors $Tr_{15}$ and $Tr_{16}$ connected in series between the positive voltage $V_1$ and the negative voltage $V_2$ and pulses $\Phi_{1R}$ and $\Phi_{2R}$ which are synchronous with shift pulses $\Phi_1$ and $\Phi_2$. When an output $Q_1$ is HIGH level, a transistor $Tr_{14}$ becomes conductive to force a gate voltage of the transistor $Tr_{13}$ to 0 to release resetting.

6 Claims, 10 Drawing Sheets

THIN FILM BOOT STRAP SHIFT REGISTER

BACKGROUND OF THE INVENTION

1. Field of the Invention

The present invention relates generally to a thin film integrated circuit employing a thin film transistor formed with non-monocrystalline silicon, such as amorphous silicon, polycrystalline silicon or so forth. More specifically, the invention relates to a thin film integrated circuit which has a function of recovering fluctuation of a threshold voltage of a thin film transistor.

2. Description of the Related Art

In the recent years, demand for downsizing of electronic apparatus and devices to be employed in the electronic apparatus has been getting more and more stronger. In an image original reading apparatus, such as facsimile and so forth, contact image sensors have become frequently used. On the other hand, in image display apparatus, liquid crystal display panel and so forth have become frequently used.

A pixel as a unit of reading in the contact image saensor is constituted of an optoelectric conversion element. In such case, if signal processing circuits are provided for each pixel in one-by-one basis, occupied area of the signal processing circuits in the overall device becomes quite large in comparison with the occupied area of the pixel portions to spoil merit of downsizing. Furthermore, necessity of large number of signal processing circuit naturally cause rising of cost. This is true even in the case of the liquid crystal display panel. Particularly, in case of the liquid crystal display panel, a two dimensional display is typically employed to make physically impossinble to construct the device with the signal processing circuits corresponded to the pixels in one-by-one basis.

Therefore, as a solution for this, in case of the contact image sensor, pixel groups are separated into a plurality of blocks, and these blocks are wired in matrix so that image signal is sequentally extracted per block. On the other hand, in the liquid crystal display panel, pixels are separated per each scanning line to form blocks, and these blocks are wired in matrix to sequentially write in image display signal to respective pixels per block.

Furthermore, recently, as a system for sequentially selecting switching elements constituted of thin film transistor and provided for each pixel, there has been proposed to form the switching elements and a shift register circuit on a common substrate by constructing a shift register with thin film transistors in place of an individual IC.

As the shift register circuit of this system, a circuit shown in FIG. 1 has been known conventionally. The operation of the circuit of FIG. 1 is illustrated in FIG. 2. To drain electrodes of thin film transistors $Tr_{12}$ and $Tr_{32}$, a clock $\Phi_1$ is applied, and to drain electrodes of thin film transistors $Tr_{22}$ and $Tr_{42}$, a clock $\Phi_2$ having opposite phase to the clock $\Phi_1$ is applied. When a HIGH level (hereinafter referred to as H level) start pulse D is applied to a gate electrode of a transistor $Tr_{11}$, the transistor $Tr_{11}$ turns ON to charge a node $A_1$ up to a power source voltage $V_{DD}$. The node $A_1$ forms a capacitor with a gate-drain electrode capacity and a gate-source electrode capacity of the transistor $Tr_{12}$ and a gate-drain electrode capacity of a transistor $Tr_{13}$. Then, the start pulse D drops to be LOW level (hereinafter referred to as L level), the transistor $Tr_{11}$ turns OFF to hold a charge at the node $A_1$.

Next, when the clock $\Phi_1$ is risen to be H level, the potential at the node $A_1$ is pulled up beyond the power source voltage $V_{DD}$ by a boot strap effect. In conjunction therewith, an output $Q_1$ of the driving transistor $Tr_{12}$ becomes H level to drive a load $Z_1$. Then, when the clock $\Phi_1$ falls to L level, the output $Q_1$ falls to be L level. Subsequently, an output $Q_2$ is risen to be H level. Thus, the gate electrode of a resetting transistor $Tr_{13}$ is turned into H level to turn the transistor $Tr_{13}$ ON. As a result, the potential at the node $A_1$ is reset to the ground level to turn OFF the transistor $Tr_{12}$. In the manner set forth above, the output Q is shifted sequentially.

Since the foregoing example employs the boot strap effect, a voltage higher than the power source voltage $V_{DD}$ can be applied to the gate electrode of the thin film transistor $Tr_{12}$. As a result, sufficient ON current can be advantageously taken out from the driving transistor. On the other hand, since there is no passing through current flowing directly from the driving transistor to the grounding potential, a shift register with low power consumption can be realized.

However, since a period to maintaining the node $A_1$ is electrically floating condition is long, the potential at the node $A_1$ may unstably fluctuate by external noise and so forth to easily cause malfunction in the register circuit. For example, in case of the example of FIG. 2, the potential of the node $A_1$ is fixed only when the start pulse D or the output $Q_2$ is high level. Accordingly, in order to avoid malfunction, the potential at the node $A_1$ is to be fixed at L level except for the period where the potential at the node $A_1$ is H level. This can be achieved by applying H level voltage to the gate electrode of the resetting transistor $Tr_{13}$ of FIG. 1.

In the meanwhile, an amorphous thin film transistor and a polycrystalline thin film transistor have defect at the interface between a gate insulation layer and a semiconductor layer and within the layer, fluctuation of threshold voltage can be easily caused. Namely, when gate-source voltage is applied to the thin film transistor, a threshold voltage may fluctuate into positive if the applied voltage is positive. Conversely, if the gate-source voltage is negative, the threshold voltage is fluctuate into positive. It has been known that the fluctuation amount is generally proportional to applied gate-source voltage value and a charge period. Fluctuation of the threshold voltage can be improved in certain extent by reducing defects at the interface and layer. In those transistors set forth above which are not a single crystalline transistor, it is currently impossible to ultimately eliminate fluctuation of threshold voltage.

As set forth above, applying the positive (H level) voltage between the gate and the source electrode for a long period causes fluctuation of the threshold voltage of the resetting transistor $Tr_{13}$ into positive. Therefore, if the gate-source voltage to turning ON the transistor $Tr_{13}$ is constant, the ON current of the thin film transistor can be lowered. Accordingly, the transistor $Tr_{13}$ cannot be reset sufficiently, to lead malfunction of the shift register circuit.

As a measure for the problem in the case where a transistor having fluctuation of the threshold voltage is employed, there is a known technology disclosed in Japanese Unexamined Patent Publication (Kokai) No. Heisei 5-267636, for example. FIG. 3 is a circuit diagram shown in the publication. In FIG. 3, transistors $Tr_3$ and $Tr_4$ are transistors for resetting a node AA, in which fluctuation of the threshold voltage is reduced by reducing charge period of the gate-source voltage for respective transistors by charging the positive gate-source voltage to these transistors in time series. On the other hand, utilizing boot strap effect in a gate electrode portion of the transistor $Tr_{12}$, a large ON current of the driving transistor can be certainly maintained by applying higher voltage than the power source voltage $V_{DD}$ to the gate electrode portion of the driving transistor $Tr_{12}$. Furthermore, by boot strap effect via a capacitor $C_B$, even when the threshold voltages of the resetting transistors $Tr_3$ and $Tr_4$ are fluctuate in the positive direction, resetting performance can be enhanced by assuring certain extent of ON current.

However, in the prior art disclosed in the above-mentioned publication, the following problem is encountered. Namely, in the circuit disclosed Japanese Unexamined Patent Publication No. Heisei 5-267636, even when a plurality of resetting transistors are employed, it is not possible to completely prevent fluctuation of the threshold voltage as long as the positive gate-source voltage is applied. Furthermore, while the gate-source voltage of the resetting transistors is boosted utilizing boot strap effect of the capacitor $C_B$, it is not possible to expand the operation life of the shift register, because the positive fluctuation of the threshold voltage is caused to be increased.

On the other hand, a system for charging negative voltage between the gate and source for returning the threshold voltage fluctuated into positive to an initial level, has been disclosed in Japanese Unexamined Patent Publication No. Heisei 5-30278. FIG. 4 shows a circuit diagram shown in the above-identified publication. To a voltage terminal $V_{C1}$, a negative voltage is set. A resistor $R_{11}$ is set at sufficiently larger resistance value than a load resistance of an inverter constructed by transistors $Tr_{12}$ and $Tr_{13}$. Namely, the transistor $Tr_{12}$ is a load transistor. In the publication, there is a statement that the resistance value of the load transistor is preferably greater than the ON resistance of the driving transistor $Tr_{13}$ in the extent of more than or equal to six times of ON resistance. When the output of the inverter turns into LOW level and a pass transistor $Tr_{11}$ is turned OFF, the negative voltage is charged to the gate electrode via a resistor $R_{11}$. By this, the threshold voltage fluctuated into positive is returned to the normal level.

However, in the circuit disclosed in Japanese Unexamined Patent Publication No. Heisei 5-30278, since the circuit construction is an inverter system, a problem that a through current of the circuit is present to cause large power consumption, is encountered. On the other hand, in the light of the field of products of the present invention, the load to be driven by the shift register is a matrix wiring and sensor elements or switching elements of thin film transistor connected to the matrix wiring. Therefore, the electric property of the load to be driven can be regarded as a distributed constant circuit of resistance and capacity. The resistance is the resistance of the conductor of the matrix wiring, and the capacity is a capacity of the matrix wiring conductor and a parasitic capacitor of sensor elements or switch elements. The resistance can be significantly reduced by forming the wiring conductor of a material having small electric resistance, e.g. aluminum and so forth. However, it is currently not possible to realize significant reduction of production process of the capacitor.

Accordingly, considering the external load of the inverter of FIG. 4, a time constant when the output is varied from L level to H level is determined by a resistance value and a load capacity of the transistor $Tr_{12}$. Also, a time constant when the output is varied from H level to L level is determined by an ON resistance and a load capacity of the transistor $Tr_{13}$. Accordingly, in the desired circuit constant setting condition, the time constant when the output varies from L level to H level becomes six times greater than the time constant when the output is varied from H level to L level to make rising and falling of the output pulse configuration asymmetric. Therefore, when a size of the transistor $Tr_{12}$ is determined to have a desired time constant of the rising period, the element size of the transistor $Tr_{13}$ becomes significantly large to make downsizing of the device difficult for large occupying area of the shift register circuit. Furthermore, since the element parasitic capacity becomes larger at greater element size, a time constant upon application of load voltage due to the resistance $R_{11}$ becomes long to make it impossible to obtain sufficient recovery effect of fluctuation of threshold voltage.

SUMMARY OF THE INVENTION

It is an object of the present invention to provide a thin film integrated circuit which can realize lower power consumption and downsizing with increasing load driving performance and does not cause malfunction over a long period and has high reliability by recovering fluctuation of a threshold voltage even when a thin film transistor having fluctuation of the threshold voltage is employed.

A thin film integrated circuit according to the present invention is characterized in that, in a thin film integrated circuit with a shift register circuit formed with thin film transistors, boot strap effect is utilized for boosting driving performance of a driving transistor and a signal having negative voltage is applied to a resetting circuit including a resetting transistor for recovering fluctuation of threshold voltage of the thin film transistor.

Since the thin film integrated circuit according to the present invention has a dynamic action type shift register circuit causing boot strap effect and a gate voltage including a voltage of negative polarity is applied to the resetting transistor of the shift register circuit, the thin film integrated circuit having the shift register circuit achieving low power consumption by dynamic operation, high load driving performance by boot strap effect and being compact and stable against external noise. Furthermore, since fluctuation of the threshold voltage of the thin film transistors can be recovered, the shift register circuit may operate for a long period without causing malfunction to achieve high reliability.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The preferred embodiments of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
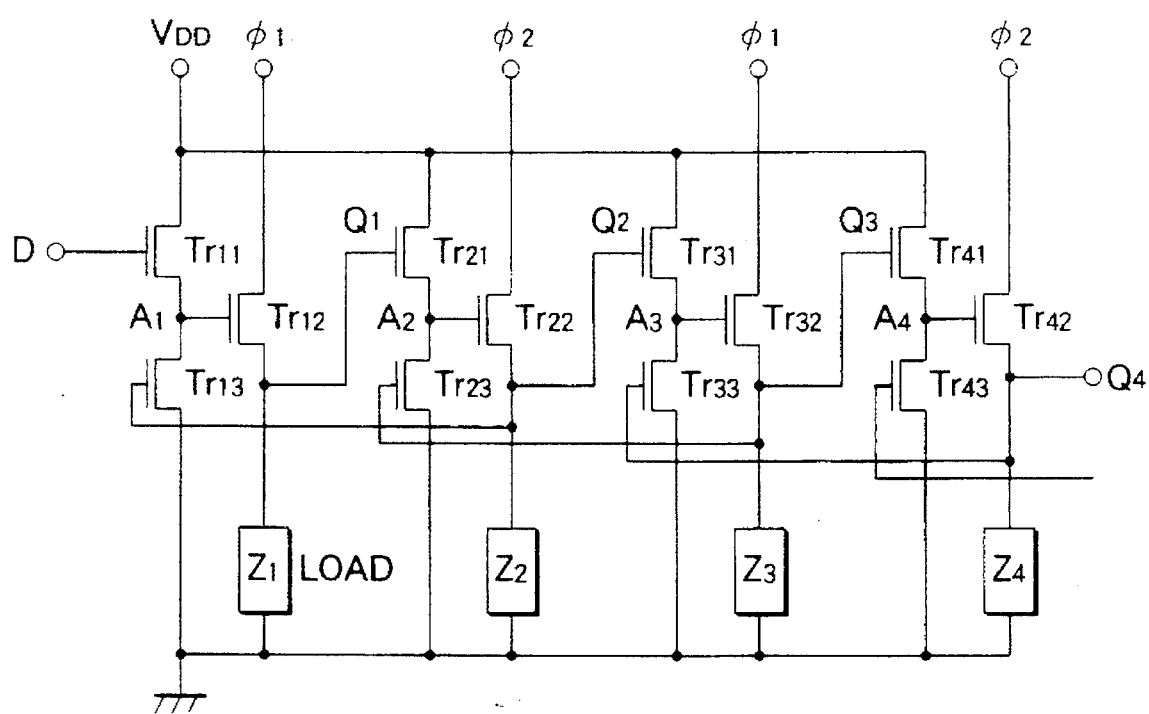
FIG. 1 is a circuit diagram showing one example of the conventional shift register circuit to be employed in a thin film integrated circuit having an optoelectric conversion element.
Figure 2:
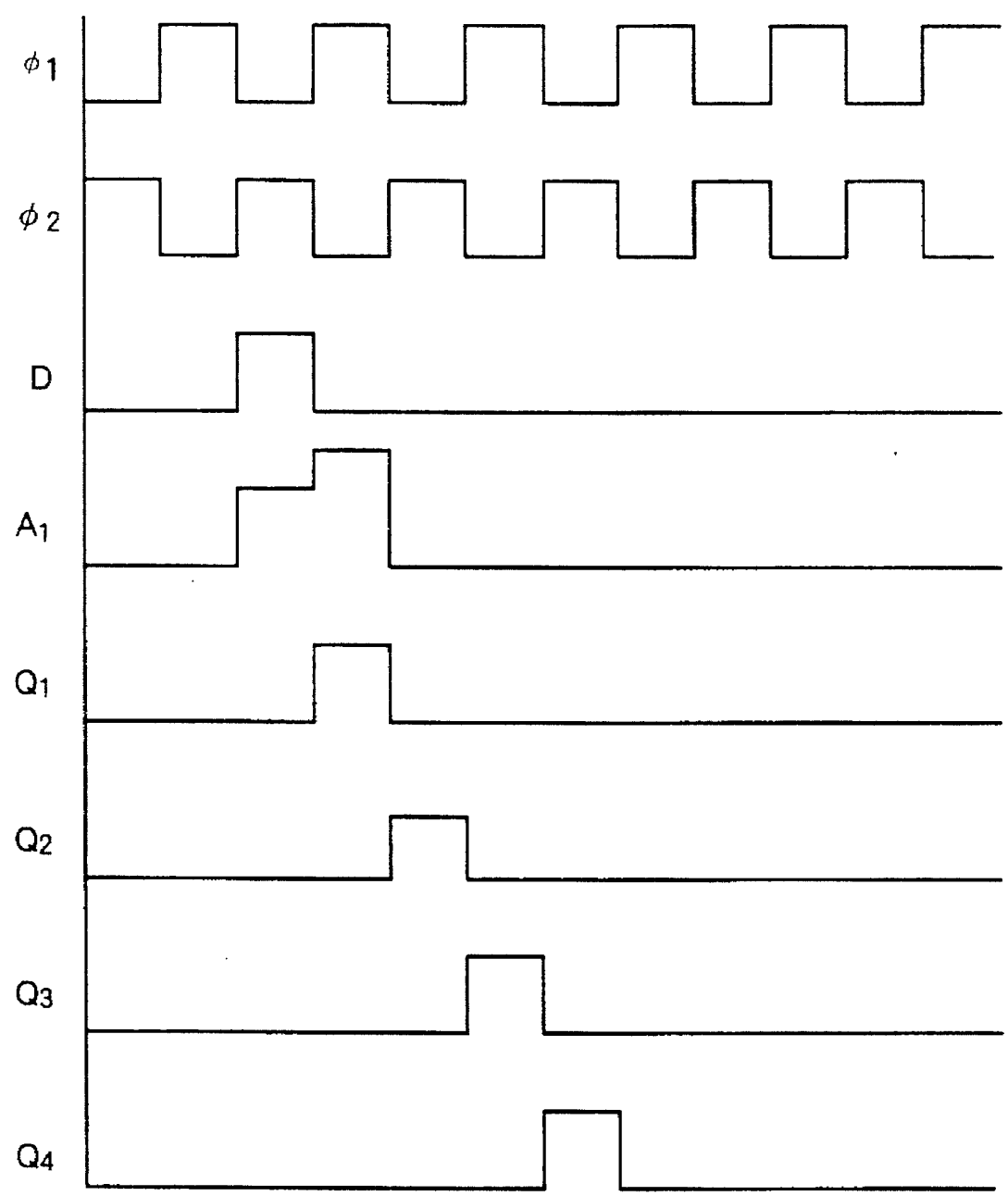
FIG. 2 is a timing chart of the shift register circuit shown in FIG. 1.
Figure 3:
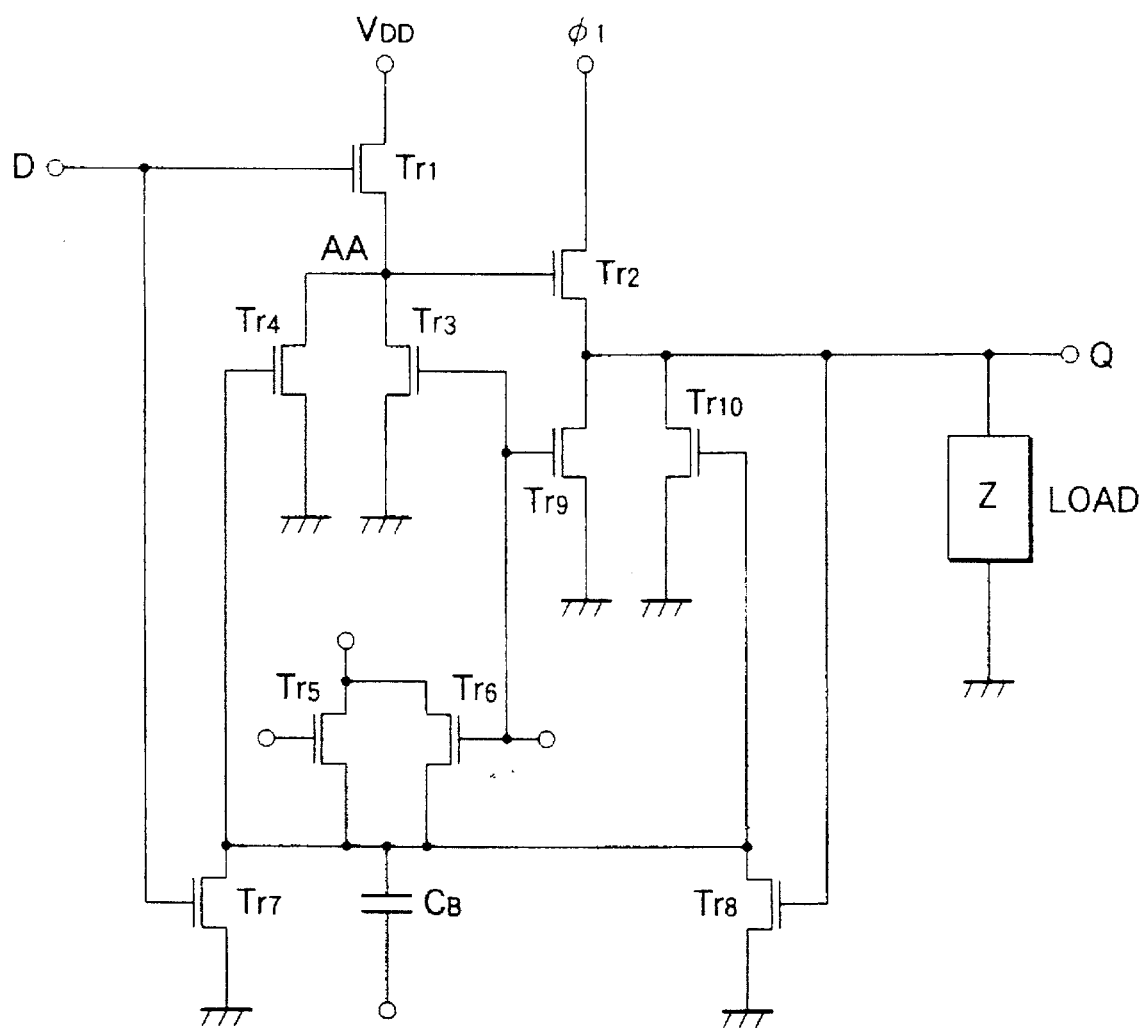
FIG. 3 is another circuit diagram of the conventional circuit to be employed in a thin film integrated circuit having an optoelectric conversion element.
Figure 4:
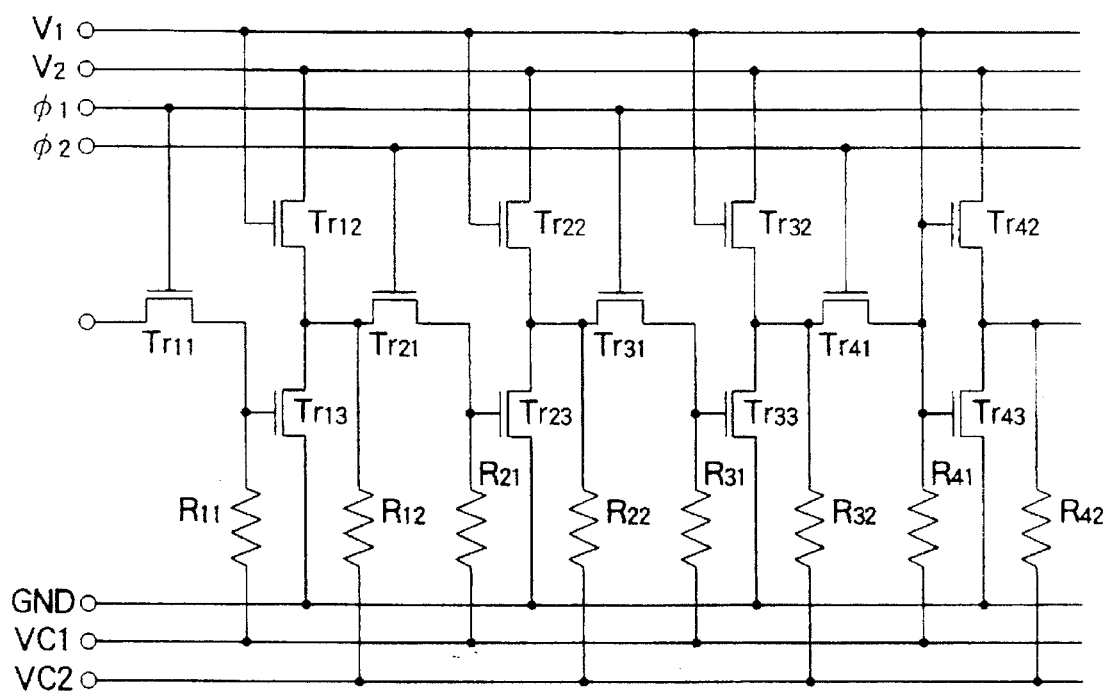
FIG. 4 is a further circuit diagram of the conventional circuit to be employed in a thin film integrated circuit having an optoelectric conversion element.
Figure 5:
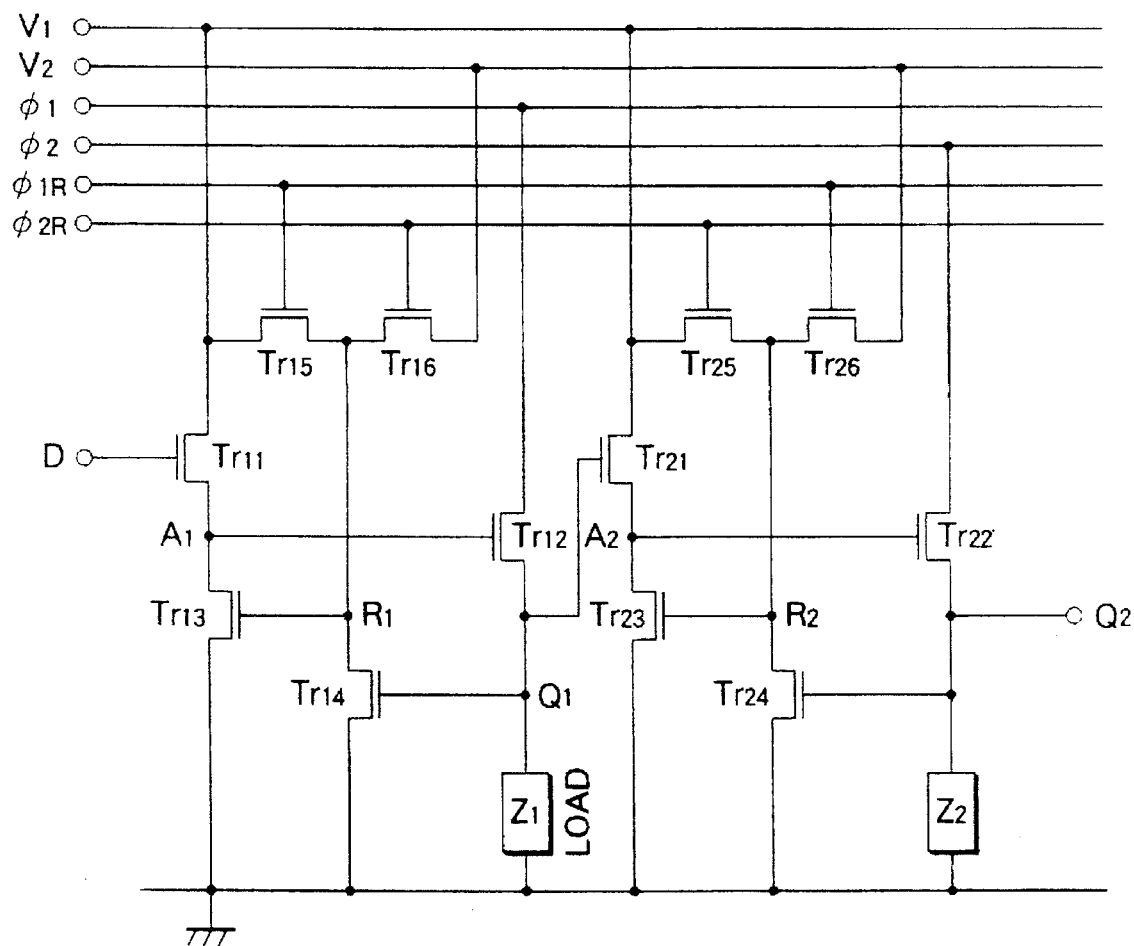
FIG. 5 is a circuit diagram showing a shift register circuit employed in a thin film integrated circuit according to the first embodiment of the invention.
Figure 6:
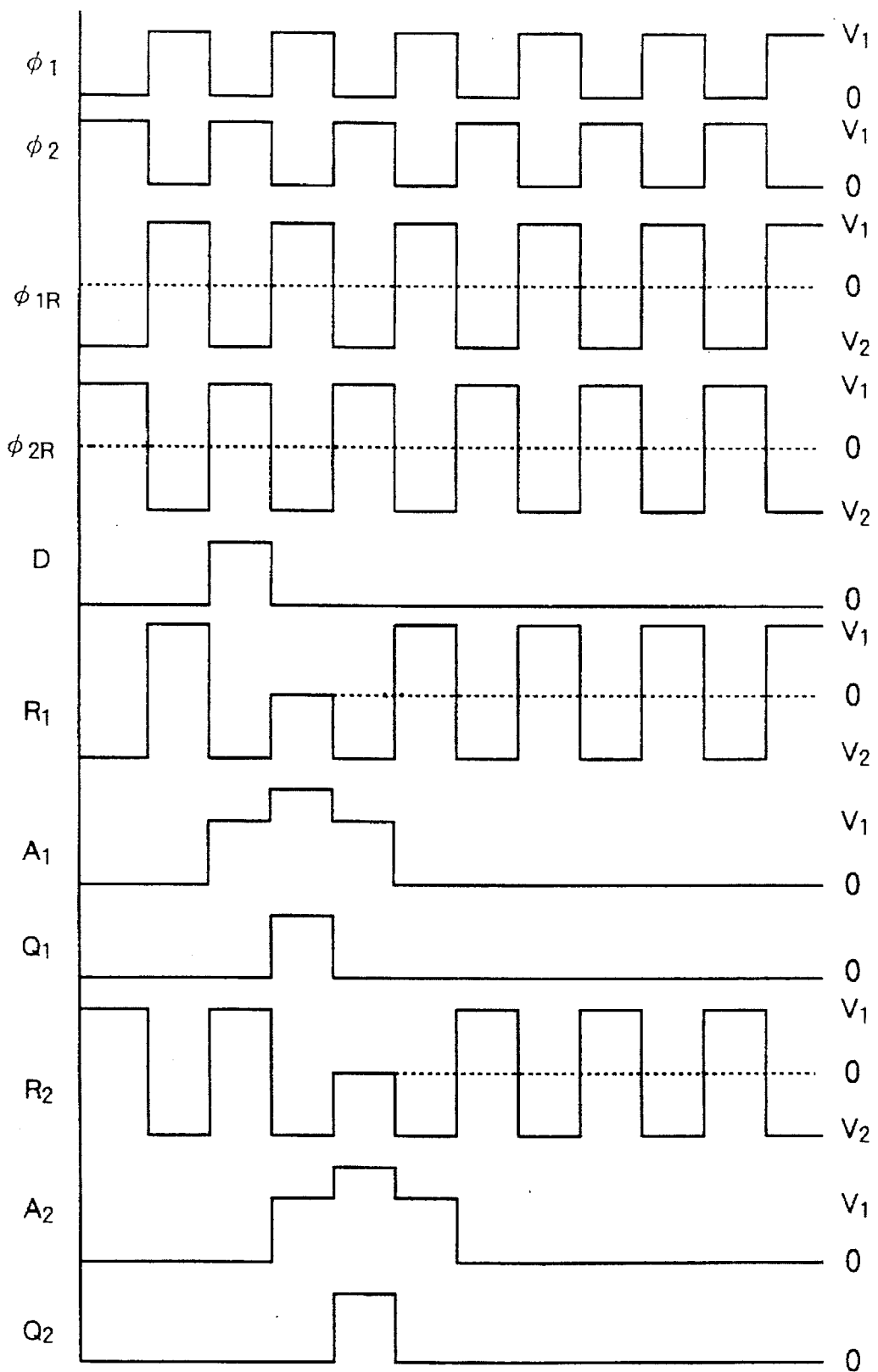
FIG. 6 is a timing chart of the shift register shown in FIG. 5.

FIG. 5 is a circuit diagram of a shift register circuit in a thin film integrated circuit according to the first embodiment the present invention, and FIG. 6 is a timing chart thereof. Referring to FIGS. 5 and 6, a positive power source voltage $V_1$ is applied to drain electrodes of transistors $Tr_{11}$ and $Tr_{16}$. To a source electrode of the transistor $Tr_{16}$, a negative power source voltage $V_2$ is applied. A clock $\Phi_1$ has a voltage amplitude of 0 to $V_1$, and a clock $\Phi_2$ is a clock having an same voltage amplitude and an opposite phase to the clock $\Phi_1$. A clock $\Phi_{1R}$ has the same phase to the clock $\Phi_1$ and a voltage amplitude of $V_2$ to $V_1$, and a clock $\Phi_{2R}$ has the same amplitude to the clock $\Phi_{1R}$ but has the opposite phase.

When H level of a start pulse D is applied to the gate electrode of the transistor $Tr_{11}$, the transistor $Tr_{11}$ is turned ON to charge a node $A_1$ up to the power source voltage $V_1$. The node $A_1$ forms a capacitor with gate-drain electrode capacity and gate-source capacity of the transistor $Tr_{12}$ and a gate-drain electrode capacity of the transistor $Tr_{13}$. When the start pulse D falls down to L level, the transistor $Tr_{11}$ is turned OFF so that the node $A_1$ holds the charge.

Next, the clock $\Phi_1$ is risen to H level, the potential at the node $A_1$ is elevated to be higher than or equal to the power source voltage $V_{DD}$ by a boot strap effect. In conjunction therewith, an output $Q_1$ becomes H level via the driving transistor $Tr_{12}$ for driving the load $Z_1$.

Subsequently, when the clock $\Phi_1$ is lowered to be L level again, the output $Q_1$ is lowered to be L level. In conjunction therewith, the potential at the node $A_1$ is returned to the power source voltage $V_{DD}$ by the boot strap effect.

As set forth above, since the shown embodiment utilizes the boot strap effect, a voltage higher than the power source voltage $V_{DD}$ can be applied to the gate electrode of the thin film transistor $Tr_{12}$. As a result, sufficient ON current can be taken out from the transistor $Tr_{12}$. Accordingly, in comparison with the case where the boot strap effect is not utilized, the size of the transistor $Tr_{12}$ can be made smaller. In general, since the driving transistor is required the largest driving performance among the transistors constituting the shift register circuit, reduction of the size of this transistor may significantly contribute for downsizing of the shift register circuit.

On the other hand, according to the shown embodiment, since there is no circuit through current directly flowing from the driving transistor to the grounding voltage, a power consumption of the shift register can be made smaller.

Next, discussion will be given for resetting operation of the node $A_1$. A node $R_1$ alternatively fix potentials $V_1$ and $V_2$ by alternately turning ON and OFF the transistors $Tr_{15}$ and $Tr_{16}$. Namely, the potential of the node $R_1$ is a pulse wave having a 50% of duty ratio having a voltage amplitude of $V_1$ to $V_2$. Here, consideration is given for a condition where the load $Z_1$ is driven, namely the output $Q_1$ is varied from 0 to H level. At this time, by turning ON of the transistor $Tr_{16}$, the potential of the node $R_1$ is naturally varied from $V_2$ to $V_1$. However, since the transistor $Tr_{14}$ is turned ON simultaneously, the voltage at the node $R_1$ is fixed at 0. At this condition, the transistor $Tr_{13}$ is held OFF to maintain the node $A_1$ not reset. It should be noted that the size of the transistor $Tr_{14}$ is assumed to be sufficiently large in comparison with the transistors $Tr_{15}$ and $Tr_{16}$.

In the shown embodiment, considering the voltage to be applied between the gate and source of each of transistors, the gate voltage of the transistors $Tr_{15}$, $Tr_{16}$ and $Tr_{18}$ are the pulse wave having 50% of duty ratio having positive and negative voltage amplitude of $V_1$ to $V_2$. As set forth above, the threshold voltage of the thin film transistor is varied in positive and negative direction, when the gate-source voltages having opposite polarity and equal absolute value of voltage are applied, the fluctuation magnitude of the threshold voltages are not necessarily equal to each other. In general, the fluctuation magnitude of the threshold voltage by the positive voltage is greater than that of the negative voltage in the extent of two to four times. Accordingly, by setting the positive and negative voltage $V_1$ and $V_2$ depending upon fluctuation magnitudes, balance between the fluctuation magnitude of the threshold voltage and the recovery magnitude is established. As a concrete example, by applying positive voltage $V_1$ and negative voltage $V_2$ which establish $|V_1/V_2|=2$ to 4, fluctuation magnitude of the threshold voltage can be restricted in quite small. By this, it becomes possible to maintain stable operation of the shift register for a long period.

On the other hand, since the node $A_1$ is sequentially reset by the pulse wave of 50% duty ratio the same as the clock pulse, stability of the node $A_1$ against the external noise can be certainly maintained.

Figure 7:
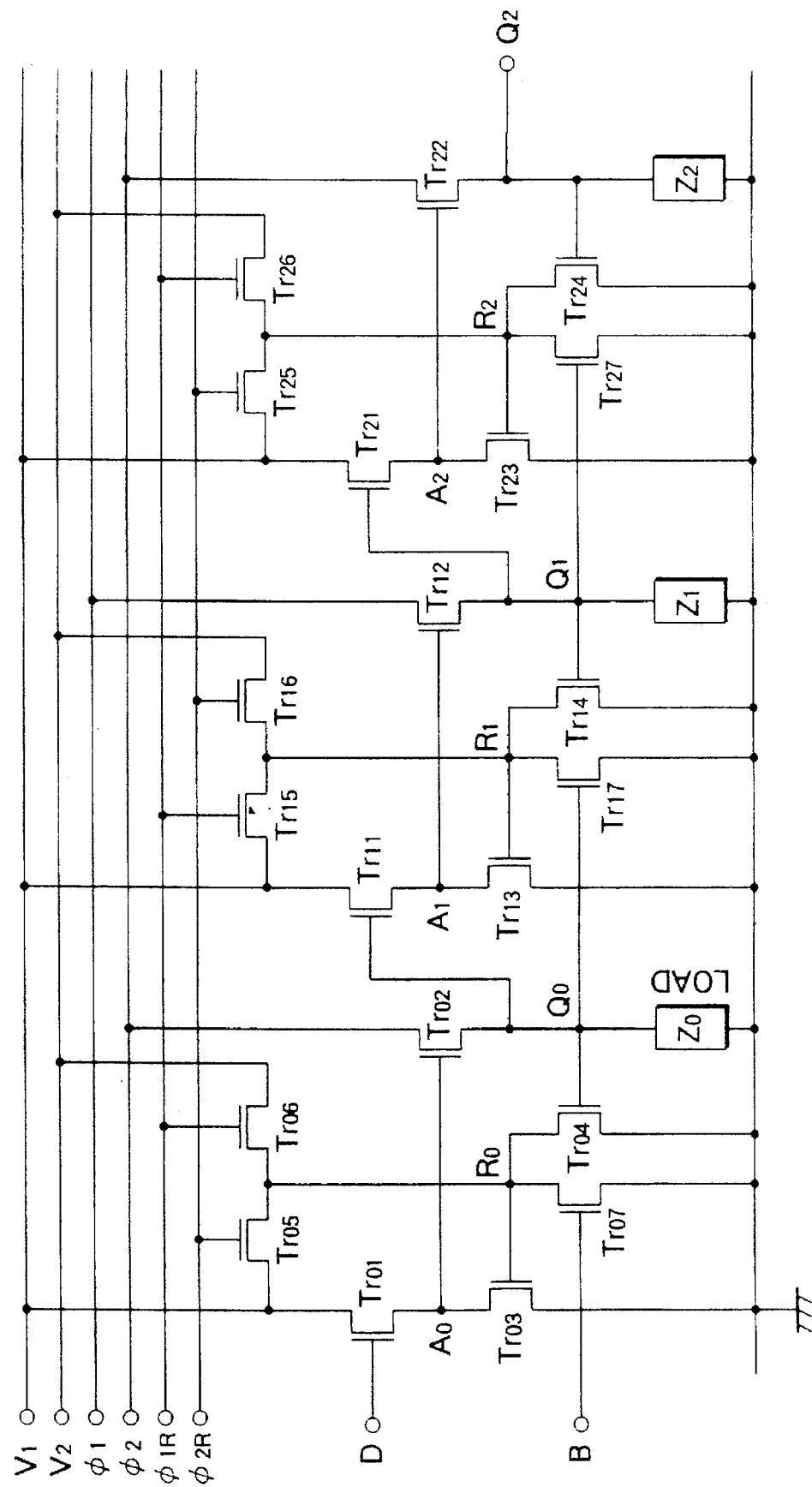
FIG. 7 is a circuit diagram showing a shift register circuit employed in a thin film integrated circuit according to the second embodiment of the invention.
Figure 8:
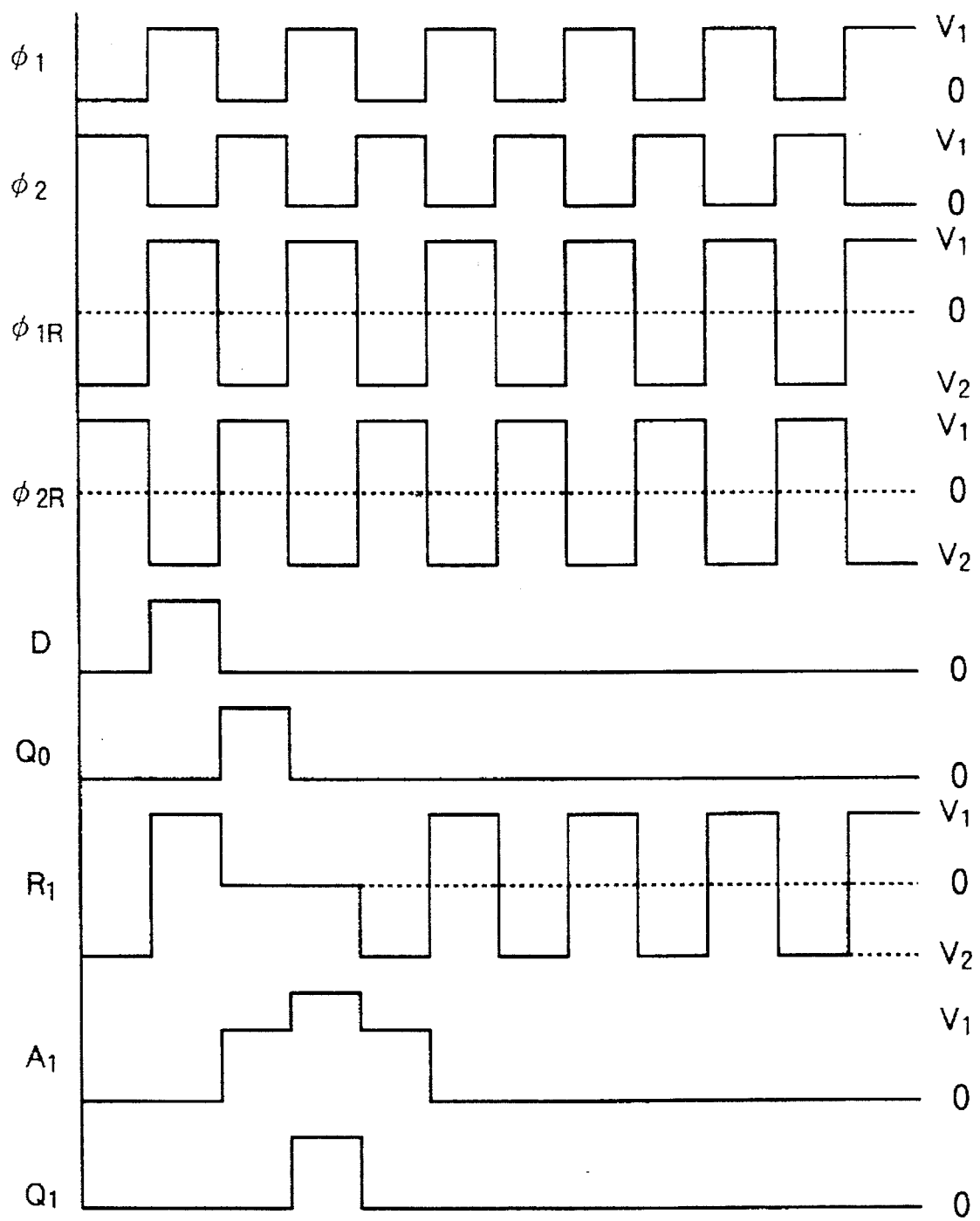
FIG. 8 is a timing chart of the shift register shown in FIG. 7.

Next, the second embodiment of the present invention will be discussed. FIG. 7 is a circuit diagram showing the thin film integrated circuit according to the second embodiment of the invention, and FIG. 8 is a timing chart thereof. It should be noted that shifting operation is the same as that in the first embodiment.

Resetting operation of the node $A_1$ will be discussed. Normally, the node $R_1$ is alternately fixed at the potentials $V_1$ and $V_2$ by alternately turn ON and OFF the transistors $Tr_{15}$ and $Tr_{16}$. Namely, the potential of the node $R_1$ is a pulse wave having the duty ratio of 50% and having voltage amplitude in a range of $V_1$ to $V_2$. Here, since the former stage load $Z_0$ is driven immediately before driving of the load $Z_1$, the output $Q_0$ becomes H level to turn a transistor $Tr_{17}$ ON. Accordingly, instead of the operation where the potential of the node $R_1$ is naturally varied from $V_1$ to $V_2$, the potential is held 0 by the transistor $Tr_{17}$. When the load $Z_1$ is driven, since the transistor $Tr_{14}$ becomes ON condition, the potential of the node $R_1$ is maintained 0. In these sequence of conditions, the transistor $Tr_{13}$ is held OFF. Therefore, the node $A_1$ is not reset. It should be noted that the size of the transistor $Tr_4$ is assumed to be sufficiently large in comparison with those of the transistors $Tr_{15}$ and $Tr_{16}$.

With the shown embodiment, even when the output $Q_1$ is varied to H level, the transistor $Tr_{13}$ is stably maintained in OFF state.

Figure 9:
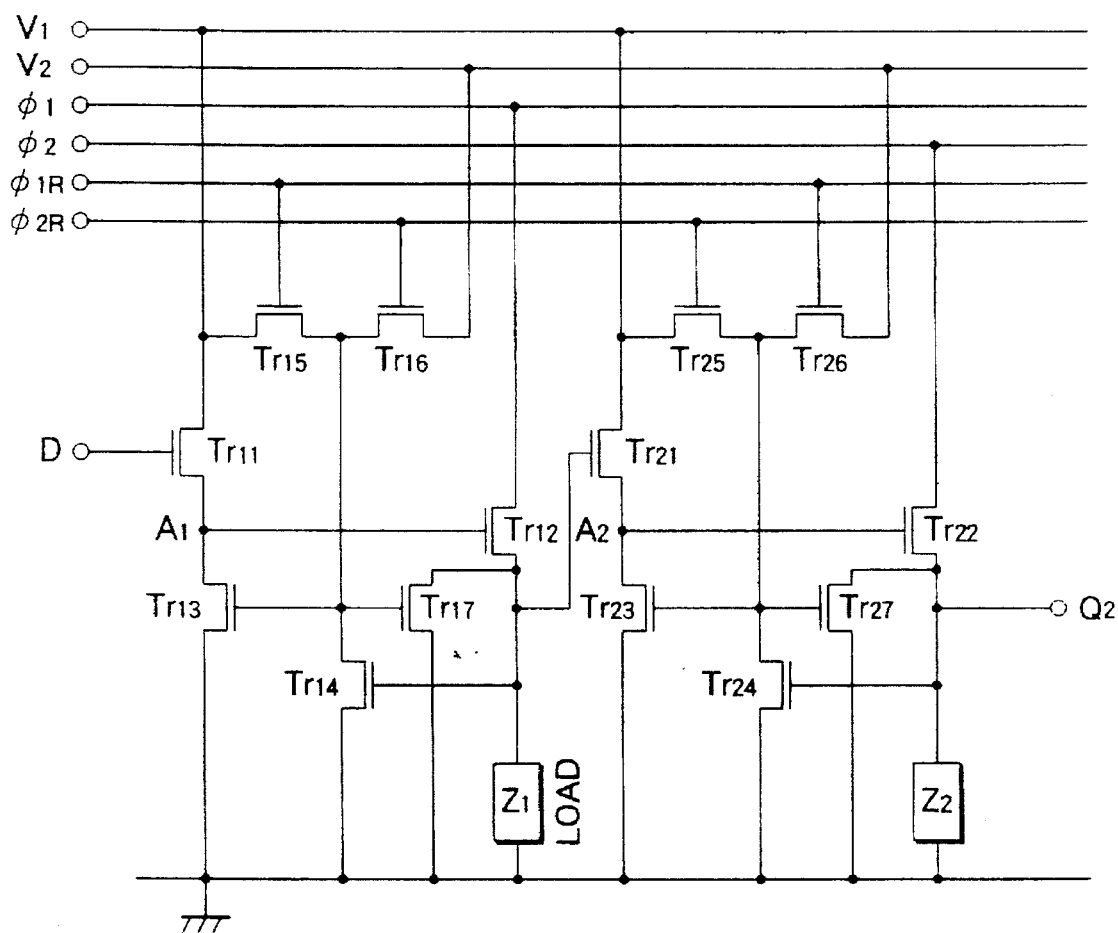
FIG. 9 is a circuit diagram showing a shift register circuit employed in a thin film integrated circuit according to the third embodiment of the invention.

Next, the third embodiment of the present invention will be discussed. FIG. 9 is a circuit diagram showing the thin film integrated circuit according to the second embodiment of the invention. The timing chart is the same as that of the FIG. 6, as illustrated in FIG. 6. In the shown embodiment, in addition to the first embodiment, a resetting transistor $Tr_{17}$ is provided even at the side of the output $Q_1$. Thereby, the potential at the output $Q_1$ can be stably fixed at the ground level even when the node $A_1$ is L level and the driving transistor $Tr_{12}$ is OFF state, namely in not selected state.

Figure 10:
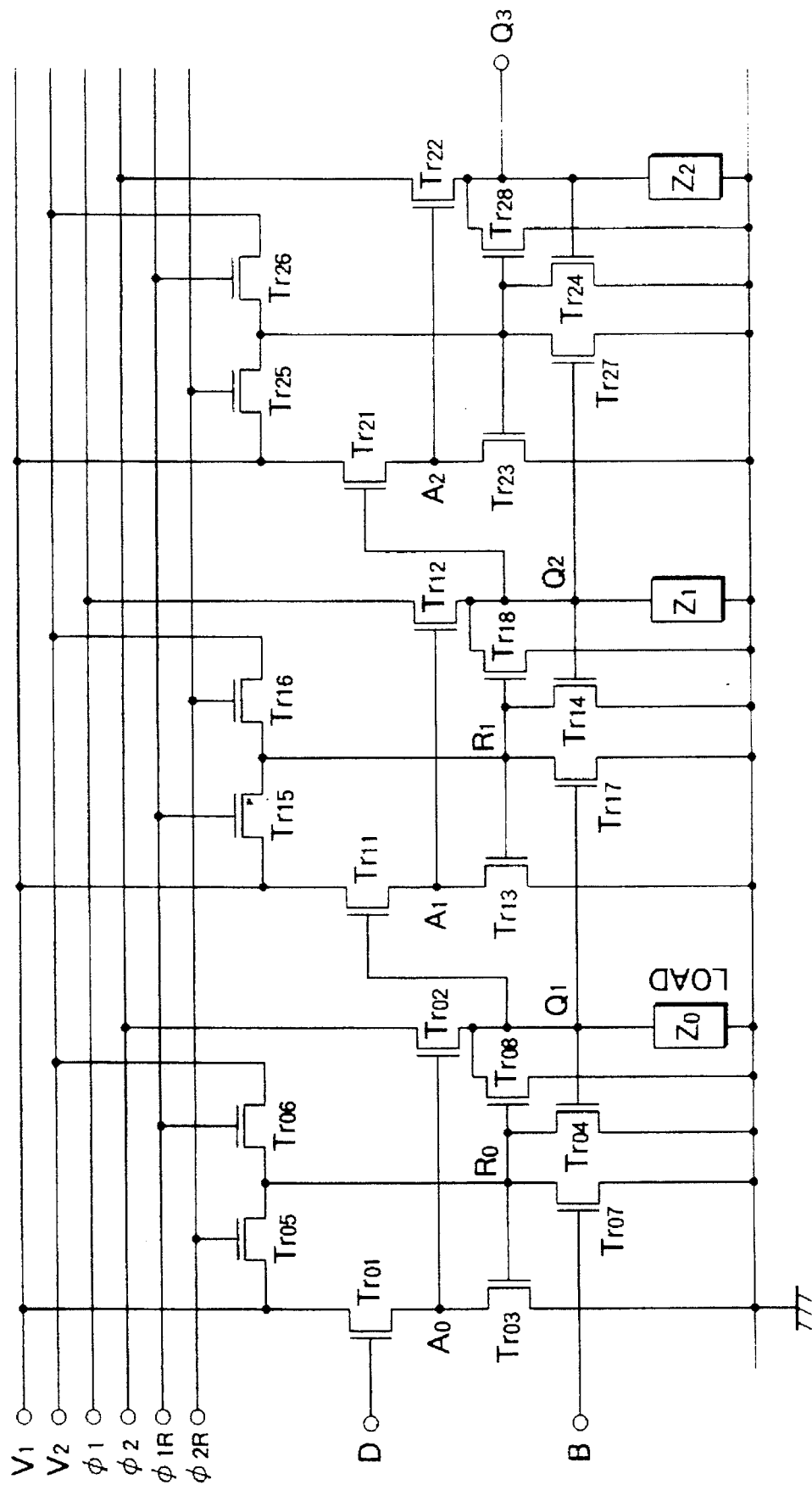
FIG. 10 is a circuit diagram showing a shift register circuit employed in a thin film integrated circuit according to the fourth embodiment of the invention.

Next, the fourth embodiment of the present invention will be discussed. FIG. 10 is a circuit diagram showing the fourth embodiment of the thin film integrated circuit according to the invention. It should be noted that the timing chart is the same as the second embodiment illustrated in FIG. 8. On the shown embodiment, by providing the resetting transistor $Tr_{17}$ even at the side of the output $Q_1$ in addition to the second embodiment, the potential at the output $Q_1$ can be stably fixed at the ground level even when the node $A_1$ is L level and the driving transistor $Tr_{12}$ is in OFF state, namely in not selected state. Also, even when the output $Q_1$ is varied into H level, the transistor $Tr_{13}$ can be stably maintained in OFF state.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A thin film integrated circuit comprising:

a plurality of circuits constituted of thin film elements provided on an insulative substrate;

a shift register constituted of thin film transistors, taking said plurality of circuits as loads, respectively and sequentially and alternately driving said loads depending upon input of a start pulse, said shift register including a plurality of signal transfer circuits connected in tandem and transferring a signal applied to a signal input point to a signal output point with a shift pulse and driving said loads by output signals thereof, a driving circuit applying mutually opposite phases of shift pulses to said plurality of signal transfer circuit for driving said load with parallel output signals thus obtained;

said individual signal transfer circuit including an input transistor taking a gate electrode as a signal input point;

a driving transistor having a gate electrode connected to primary electrodes of said input transistor, taking said primary electrode as a signal output point, to which said load is connected;

a signal transfer portion transferring a pulse signal input to said signal input point to said signal output point by a dynamic action with a boot strap effect on the basis of charge accumulation effect of a capacitance associated with the gate electrode of said driving transistor and application of a shift pulse to the other primary electrode of said driving transistor; and a resetting portion including a resetting transistor having one primary electrode connected to the gate electrode of said driving transistor and maintaining a shut-off condition while said driving transistor is in shut-off condition, and a gate voltage control means for providing a gate voltage including a voltage of negative polarity to a gate electrode of said resetting transistor.

2. A thin film integrated circuit as set forth in claim 1, wherein said gate voltage controlling means of said resetting portion comprises:

first voltage generating means for alternately generating a positive voltage and a negative voltage in synchronism with said start pulse and at the same frequency as the latter, with 50% of duty ratio; and second voltage generating means for forcedly setting a potential at the output point of said first voltage generating means to 0 potential when said driving transistor is in conductive state.

3. A thin film integrated circuit as set forth in claim 2, wherein said gate voltage controlling means of said resetting portion comprises:

first and second transistors connected in series between a positive direct current voltage supply terminal and a negative direct current voltage supply terminal, a junction of the series connection being connected to the gate electrode of said resetting transistor;

a third transistor connected for establishing a current path between a junction of series connection of said first and second transistors and a 0 potential point;

means for alternately applying said positive voltage and said negative voltage to the gate electrode of said resetting transistor by applying a pulse signal of the same phase to the shift pulse having a predetermined amplitude determined by said positive direct current voltage and said negative direct current voltage, to said first transistor as a gate input, and by applying a pulse signal of the opposite phase and the same amplitude to said gate input of said first transistor, to said second transistor, for alternately placing said first and second transistors in conductive state in response to said shift pulse; and means for forcedly setting the gate voltage of said resetting transistor at 0 by applying a signal at said signal output point to said third transistor as a gate input for placing said third transistor in conductive state while said driving transistor is in conductive state.

4. A thin film integrated circuit as set forth in claim 3, wherein said gate voltage controlling means of said resetting portion has a fourth transistor connected in parallel to said third transistor, which fourth transistor has a gate electrode connected to the signal output point of a former state signal transfer circuit.

5. A thin film integrated circuit as set forth in claim 3, wherein said gate voltage control means of said resetting portion has a fifth transistor connected to establish a current path between said signal output point and said 0 potential point, which fifth transistor has a gate electrode connected to said series junction of said first and second transistors.

6. A thin film integrated circuit as set forth in claim 4, wherein said gate voltage control means of said resetting portion has a fifth transistor connected to establish a current path between said signal output point and said 0 potential point, which fifth transistor has a gate electrode connected to said series junction of said first and second transistors.

* * * * *